United States Patent
Hsu

(10) Patent No.: US 11,139,279 B2
(45) Date of Patent: Oct. 5, 2021

(54) LIGHT-EMITTING DIODE DEVICE

(71) Applicant: EPISTAR CORPORATION, Hsinchu (TW)

(72) Inventor: Chia-Liang Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 17 days.

(21) Appl. No.: 16/389,263

(22) Filed: Apr. 19, 2019

(65) Prior Publication Data

US 2019/0244940 A1 Aug. 8, 2019

Related U.S. Application Data

(63) Continuation of application No. 15/050,271, filed on Feb. 22, 2016, now abandoned, which is a
(Continued)

(30) Foreign Application Priority Data

Nov. 13, 2007 (TW) .................................. 09614312.9

(51) Int. Cl.
*H01L 33/22* (2010.01)
*H01L 33/58* (2010.01)
(Continued)

(52) U.S. Cl.
CPC ........ *H01L 25/0753* (2013.01); *G02B 6/0031* (2013.01); *G02B 6/0073* (2013.01);
(Continued)

(58) Field of Classification Search
CPC ... H01L 33/486; H01L 25/0756; H01L 33/60; H01L 2933/0091; H01L 33/56; H01L 33/08; H01L 24/97; H01L 51/5243
See application file for complete search history.

(56) References Cited

U.S. PATENT DOCUMENTS 6,015,979 A   1/2000  Sugiura et al.
6,733,711 B2  5/2004  Durocher et al.
(Continued)

FOREIGN PATENT DOCUMENTS

CN  202268388 U  6/2012
JP  2003249692 A  9/2003
(Continued)

*Primary Examiner* — Bradley Smith
*Assistant Examiner* — David J Goodwin
(74) *Attorney, Agent, or Firm* — Muncy, Geissler, Olds & Lowe, P.C.

(57) ABSTRACT

A light-emitting diode includes a transparent substrate with a first surface, a second surface opposite to the first surface, and a side surface connected to the first surface and the second surface; a first light-emitting structure; a second light-emitting structure; a connecting layer, connected to the first light-emitting structure and the second light-emitting structure; a circuit arranged between the transparent substrate and the first light-emitting structure, and having a portion formed on the first surface without extending to the second surface; and a structure with diffusers, covering the first light-emitting structure and the second light-emitting structure on the first surface without crossing over the side surface.

20 Claims, 7 Drawing Sheets

Related U.S. Application Data continuation of application No. 13/282,317, filed on Oct. 26, 2011, now abandoned, which is a continuation of application No. 12/292,161, filed on Nov. 13, 2008, now Pat. No. 8,240,881.

(51) Int. Cl.

| | | |
|---|---|---|
| *H01L 33/50* | (2010.01) | |
| *H01L 25/075* | (2006.01) | |
| *F21V 8/00* | (2006.01) | |
| *H01L 33/48* | (2010.01) | |
| *H01L 33/60* | (2010.01) | |
| *H01L 33/62* | (2010.01) | |

(52) U.S. Cl.
CPC .......... *H01L 33/486* (2013.01); *H01L 33/507* (2013.01); *H01L 33/58* (2013.01); *H01L 33/60* (2013.01); *H01L 33/62* (2013.01); *G02B 6/0025* (2013.01); *H01L 33/48* (2013.01); *H01L 2224/48091* (2013.01); *H01L 2224/73265* (2013.01)

(56) References Cited

U.S. PATENT DOCUMENTS

| | | | |
|---|---|---|---|
| 6,735,373 B2 | 5/2004 | Umemoto | |
| 6,847,162 B2 | 1/2005 | Duggal et al. | |
| 7,040,767 B2 | 5/2006 | Lee et al. | |
| 7,073,933 B2 | 7/2006 | Gotoh et al. | |
| 7,279,723 B2 * | 10/2007 | Matsumura | H01L 25/0753 257/100 |
| 7,361,940 B2 | 4/2008 | Kim et al. | |
| 7,397,068 B2 | 7/2008 | Park et al. | |
| 7,520,642 B2 | 4/2009 | Holman et al. | |
| 7,722,220 B2 | 5/2010 | Van De Ven | |
| 7,738,053 B2 | 6/2010 | Kubota | |
| 7,977,688 B2 | 7/2011 | Kim | |
| 7,999,277 B2 | 8/2011 | Fushimi et al. | |
| 8,022,423 B2 | 9/2011 | Nakamura et al. | |
| 2002/0117676 A1 | 8/2002 | Katoh | |
| 2002/0167015 A1 * | 11/2002 | Okazaki | H01L 25/0756 257/79 |
| 2003/0160256 A1 | 8/2003 | Durocher et al. | |
| 2004/0051111 A1 | 3/2004 | Ota et al. | |
| 2004/0135504 A1 | 7/2004 | Tamaki et al. | |
| 2004/0217693 A1 | 11/2004 | Duggal et al. | |
| 2005/0133800 A1 * | 6/2005 | Park | H01L 25/0756 257/80 |
| 2005/0146270 A1 | 7/2005 | Ho | |
| 2005/0265042 A1 | 12/2005 | Kim et al. | |
| 2006/0139926 A1 | 6/2006 | Morioka et al. | |
| 2007/0086209 A1 | 4/2007 | Hwang et al. | |
| 2007/0139949 A1 | 6/2007 | Tanda et al. | |
| 2007/0196939 A1 | 8/2007 | Park et al. | |
| 2007/0206164 A1 | 9/2007 | Beeson et al. | |
| 2008/0001163 A1 | 1/2008 | Matsumura et al. | |
| 2008/0006838 A1 * | 1/2008 | Hattori | H01L 33/382 257/103 |
| 2008/0048201 A1 * | 2/2008 | Kim | H01L 33/62 257/98 |
| 2008/0079019 A1 | 4/2008 | Huang et al. | |
| 2008/0093607 A1 * | 4/2008 | Feng | H01L 33/483 257/82 |
| 2008/0111146 A1 | 5/2008 | Nakamura et al. | |
| 2008/0149949 A1 * | 6/2008 | Nakamura | H01L 33/22 257/89 |
| 2009/0129420 A1 | 5/2009 | Regaard et al. | |
| 2010/0155762 A1 | 6/2010 | Nakamura | |
| 2011/0175076 A1 | 7/2011 | Ushikubo et al. | |
| 2011/0204376 A1 | 8/2011 | Su et al. | |
| 2011/0204390 A1 | 8/2011 | Lerman et al. | |
| 2012/0037886 A1 * | 2/2012 | Hsu | H01L 33/58 257/13 |
| 2012/0256538 A1 | 10/2012 | Takeuchi et al. | |
| 2013/0056779 A1 | 3/2013 | Li | |
| 2013/0292711 A1 | 11/2013 | Ogihara et al. | |

FOREIGN PATENT DOCUMENTS

| | | |
|---|---|---|
| JP | 2006-056595 A | 3/2006 |
| JP | 2007-234975 A | 9/2007 |
| TW | 200539481 A | 12/2005 |
| TW | 200620694 A | 6/2006 |
| TW | 200635074 | 10/2006 |

\* cited by examiner

LIGHT-EMITTING DIODE DEVICE

CROSS-REFERENCE TO RELATED APPLICATIONS

This application is a continuation application of U.S. patent application Ser. No. 15/050,271, filed on Feb. 22, 2016, which is a continuation application of U.S. patent application Ser. No. 13/282,317, filed on Oct. 26, 2011, which is a continuation-in-part application of U.S. patent application Ser. No. 12/292,161, filed on Nov. 13, 2008 which claims the right of priority based on TW application Ser. No. 096143129, filed Nov. 13, 2007, entitled "LIGHT-EMITTING DEVICE PACKAGE," and the contents of which are incorporated herein by reference.

BACKGROUND

1. Technical Field

A light-emitting diode device is disclosed.

2. Description of the Related Art

Generally, light-emitting diodes (LEDs) having transparent substrates are divided into face-up type and flip-chip type. For the face-up type, the light-emitting diodes are attached to carriers by gels or metals; for flip-chip type, the light-emitting diodes are attached to carriers by metals or solders with the attached surface as the light extraction surface of the light-emitting diode or the surface parallel to it. Because the light extracted from the light-emitting layer of the light-emitting diodes are 360 degree, the light emitting downward is generally reflected to the front of the light extraction side by the reflecting layers or extracted from the transparent substrates. The thickness of the transparent substrate should be properly adjusted so that the brightness of the light extraction is acceptable. Besides, when the size of the light-emitting diodes is larger, there are more reflected light passing through the multi-quantum well (MQW) in the light-emitting layer. The light efficiency is reduced because of light absorption.

FIG. 1 shows a schematic illustration of conventional light-emitting diode device. As shown in FIG. 1, a light-emitting diode chip 100 is attached to a carrier 3 with an attached surface 1 which is parallel to the front light extraction surface 4 of the light-emitting diode chip 100. The light emitted downward is reflected to the front light extraction surface 4 or the lateral light extraction surface 5 by the reflector 2. The disadvantage of this device is when the size of the light-emitting diode chip is larger, there are more reflected light passing through the multi-quantum well (MQW) in the light-emitting layer. The light efficiency is reduced because of light absorption.

SUMMARY

A light-emitting diode device is disclosed. The light-emitting diode device includes a transparent substrate with a first surface, a second surface opposite to the first surface, and a side surface connected to the first surface and the second surface; a a first light-emitting structure; a second light-emitting structure; a connecting layer, connected to the first light-emitting structure and the second light-emitting structure; a circuit arranged between the transparent substrate and the first light-emitting structure, and having a portion formed on the first surface without extending to the second surface; and a structure with diffusers, covering the first light-emitting structure and the second light-emitting structure on the first surface without crossing over the side surface.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Figure 1:
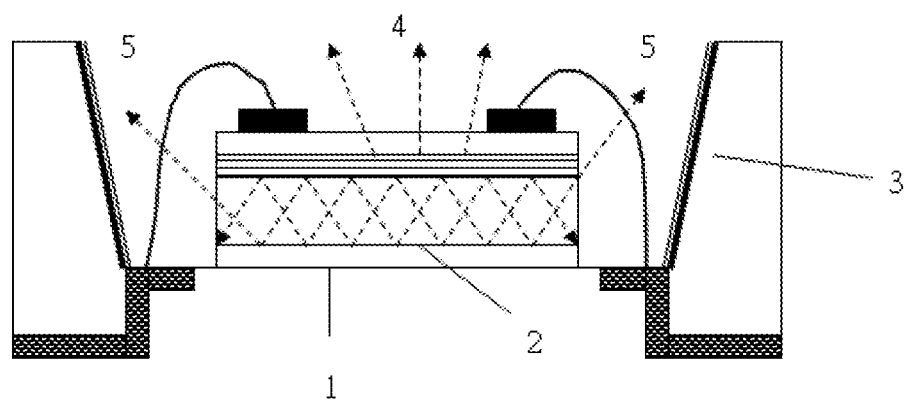
FIG. 1 is an illustration of conventional light-emitting diode device.

Reference is made in detail to the preferred embodiments of the present invention, examples of which are illustrated in the accompanying drawings. Wherever possible, the same reference numbers are used in the drawings and the description to refer to the same or like parts.

Figure 2:
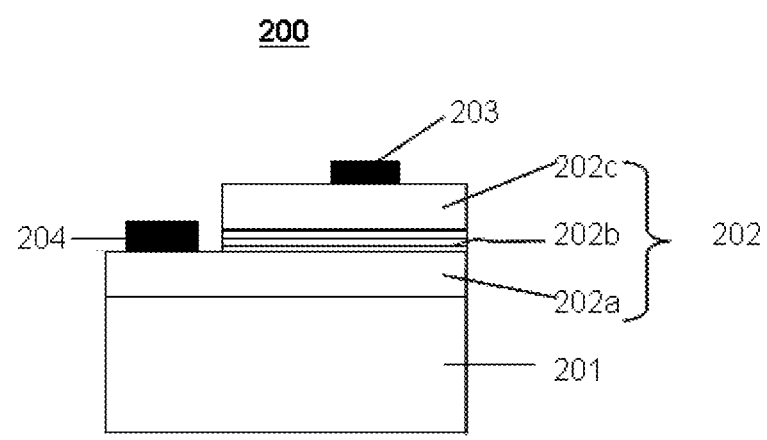
FIG. 2 is a lateral view of the light-emitting structure of the present invention.
Figure 3:
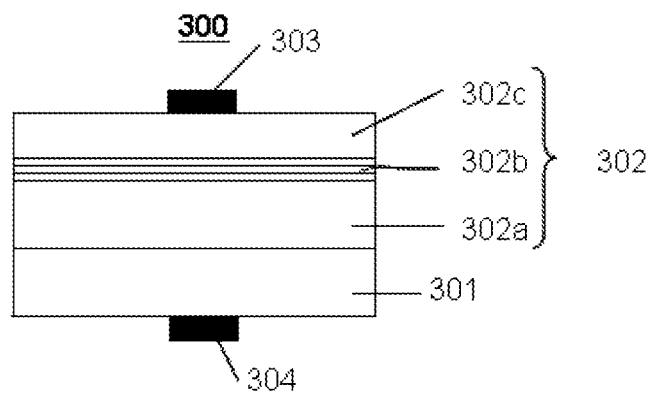
FIG. 3 is a lateral view of the light-emitting structure of another embodiment of the present invention.

FIGS. 2 and 3 show the light-emitting structures in accordance with one embodiment of the present application. Referring to FIG. 2, a structure of a light-emitting diode chip 200 includes an epitaxial structure 202 formed on the growth substrate 201 by metal-organic chemical vapor deposition (MOCVD) process or an epitaxial structure formed on the supporting substrate by a bonding process, wherein the epitaxial structure having a first conductivity type semiconductor layer 202a, an active layer 202b, and a second conductivity type semiconductor layer 202c. A first electrode 203 and a second electrode 204 are disposed on the epitaxial structure 202 to form a horizontal structure of the light-emitting diode chip 200.

The material of the growth substrate can be transparent material such as Sapphire, ZnO, or AlN. The growth substrate can also be high thermal-dissipative materials such as diamond like carbon (DLC), graphite, Si, SiC, GaP, GaAs, or $LiAlO_2$.

Referring to FIG. 3, a structure of a light-emitting diode chip 300 includes an epitaxial structure 302 formed on the growth substrate 301 by metal-organic chemical vapor deposition (MOCVD) process or an epitaxial structure formed on the supporting substrate by a bonding process, wherein the epitaxial structure having a first conductivity type semiconductor layer 302a, an active layer 302b, and a second conductivity type semiconductor layer 302c. A first electrode 303 is formed on the first side of the epitaxial structure 302 and the second electrode 304 is formed on the second side opposite to first side of the epitaxial structure 302 to form a vertical structure of the light-emitting diode chip 300.

The material of the support substrate can be transparent material or electrically insulating material such as sapphire, diamond, glass, epoxy, quartz, acrylate, ZnO, or AlN. The support substrate can also be high thermal-dissipative materials or reflective materials such as Cu, Al, Mo, Cu—Sn, Cu—Zn, Cu—Cd, Ni—Sn, Ni—Co, Au alloy, diamond like carbon (DLC), graphite, carbon fiber, metal matrix composite (MMC), ceramic matrix composite (CMC), polymer matrix composite (PMC), Si, IP, ZnSe, GaAs, SiC, GaP, GaAsP, ZnSe, InP, LiGaO$_2$, or LiAlO$_2$.

Figure 4:
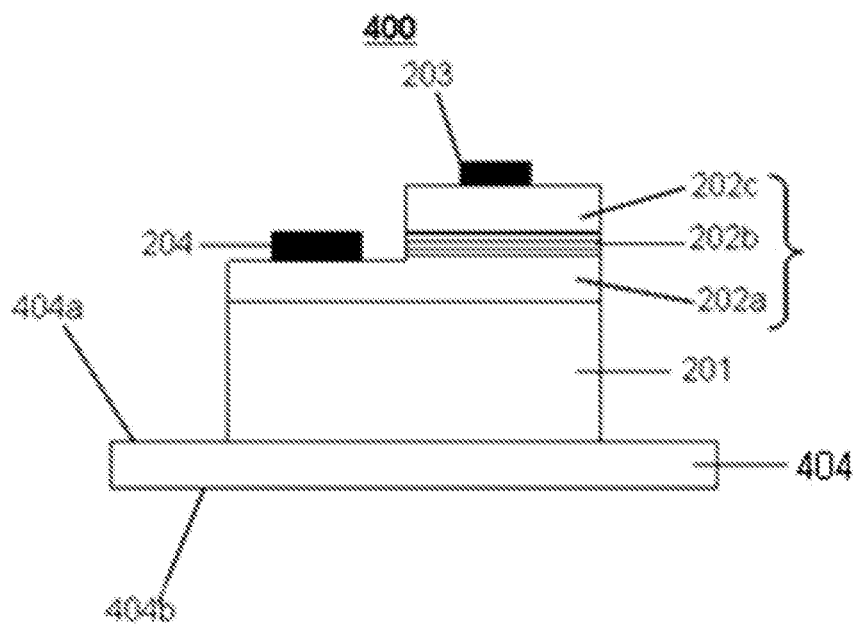
FIG. 4 is a lateral view of the light-emitting device of the present invention.

FIG. 4 is an illustration of the light-emitting device 400 in accordance with one embodiment of the present application. A structure of the light-emitting diode chip such as the light-emitting diode chip 200 or 300 is attached to a first surface 404a of the transparent substrate 404 to form a light-emitting device 400. The structure of the light-emitting diode chip 200 includes a growth substrate 201, an epitaxial structure 202 formed on the growth substrate 201 wherein the epitaxial structure having a first conductivity type semiconductor layer 202a, an active layer 202b, and a second conductivity type semiconductor layer 202c; a first electrode 203 and a second electrode 204 formed on the epitaxial structure 202.

The material of the transparent substrate can be sapphire, diamond, glass, epoxy, quartz, acrylate, ZnO, AlN, or SiC.

Figure 5:
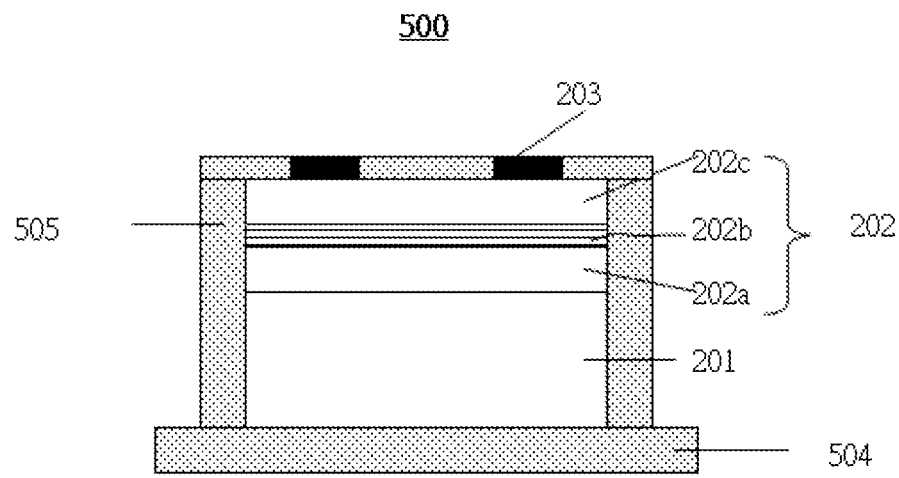
FIG. 5 is a lateral view of the light-emitting device of another embodiment of the present invention.

FIG. 5 is an illustration of the light-emitting device 500 in accordance with one embodiment of the present application. A structure of the light-emitting diode chip such as light-emitting diode chip 200 or 300 is attached to a transparent substrate 504 containing phosphor materials to form a light-emitting device 500. The structure of the light-emitting diode chip 200, includes a growth substrate 201, an epitaxial structure 202 formed on the growth substrate 201 wherein the epitaxial structure having a first conductivity type semiconductor layer 202a, an active layer 202b, and a second conductivity type semiconductor layer 202c; a first electrode 203 and a second electrode 204 formed on the epitaxial structure 202. Following, a phosphor layer 505 is positioned over and around the structure of the light-emitting diode chip 200 to form a light-emitting device 500.

As shown in FIG. 4 and FIG. 5, the structure of the light-emitting diode chip 200 or 300 can be attached to the transparent substrate 404 or 504 by a connecting layer (not shown in FIG. 4 and FIG. 5). The material of the connecting layer can be an insulating material such as polyimide, BCB, PFCB, MgO, SU8, epoxy, acrylic resin, COC, PMMA, PET, PC, polyetherimide, fluorocarbon polymer, silicone, glass, Al$_2$O$_3$, SiO$_x$, TiO$_2$, SiN$_x$, SOG, or other organic adhesive material. The material of the connecting layer can also be a conductive material such as ITO, InO, SnO, CTO, ATO, AZO, ZTO, IZO, Ta$_2$O$_5$, DLC, Cu, Al, Sn, Au, Ag, Ti, Ni, Pb, Cr, Ag—Ti, Cu—Sn, Cu—Zn, Cu—Cd, Sn—Pb—Sb, Sn—Pb—Zn, Ni—Sn, Ni—Co, or Au alloy, and so on. The material of the connecting layer can also be a semiconductor layer such as ZnO, AlGaAs, GaN, GaP, GaAs, GaAsP, and so on.

Figure 6:
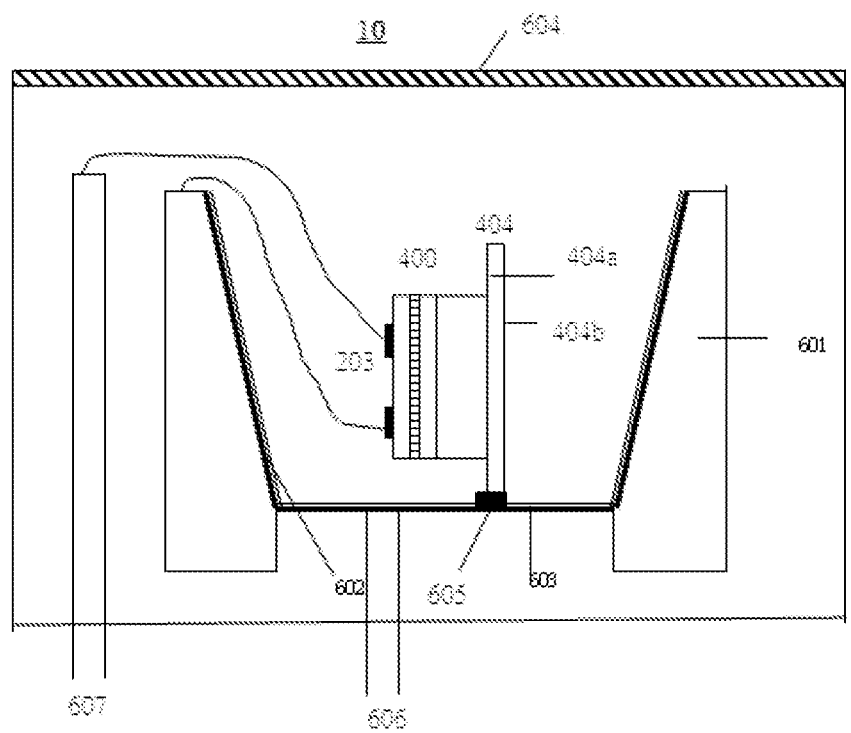
FIG. 6 is a lateral view of the light-emitting diode device of the present invention.

FIG. 6 is a lateral view of the light-emitting diode device 10 in accordance with one embodiment of the present application. The aforementioned structures of light-emitting device 400 or 500 are applicable to the light-emitting diode device 10 shown in the embodiments of the present application, and the light-emitting device 400 is chosen to describe the embodiments to avoid repeating description. Referring to FIG. 6, a carrier 601 having a reflective inside wall 602 is provided wherein the carrier can be a printed circuit board, a ceramics substrate, or a silicon substrate. A transparent substrate 404 of the light-emitting device 400 is attached to a platform 603 of the carrier 601 by an adhering material, wherein the first surface 404a of the transparent substrate 404 and its parallel surface (the second surface 404b) are disposed on the platform 603. In a preferred embodiment, the transparent substrate 404 is approximately perpendicular to the platform 603. In addition, the p and n electrode of the light-emitting device is electrically connected to a p electrode 606 and an n electrode 607 of the carrier respectively to form a light-emitting diode device 10. The light emitted from the active layer of the light-emitting device 400 is omnidirectional. The light emitted to the first surface 404a of the transparent substrate 404 is passed through the transparent substrate 404, and emitted from the second surface 404b of the transparent substrate 404. The light is reflected from the reflective inside wall 602 of the carrier and leaves the light-emitting diode device 10. Besides, a lens 604 can be positioned over the light-emitting diode device 10 to increase the light efficiency.

Figure 7:
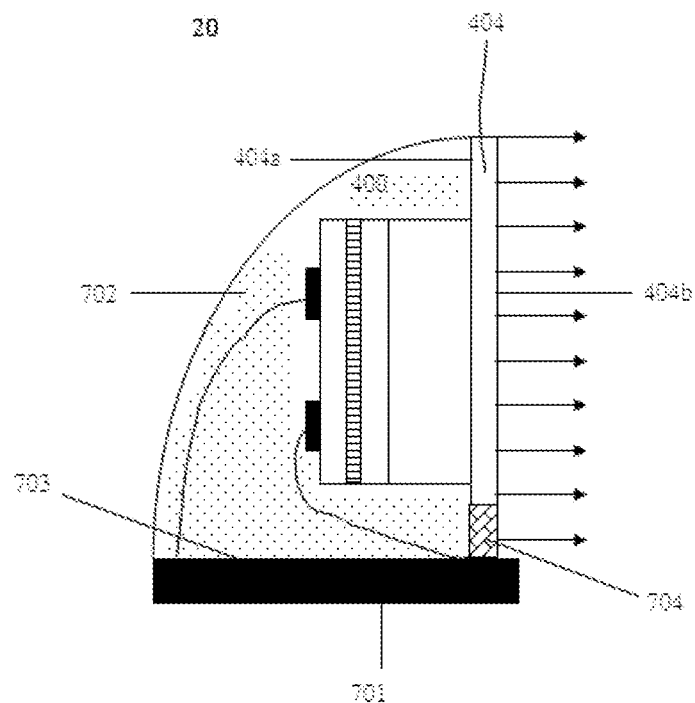
FIG. 7 is a lateral view of the light-emitting diode device of another embodiment of the present invention.

FIG. 7 is a lateral view of the light-emitting diode device 20 of the second embodiment of the present invention. A transparent substrate 404 of a light-emitting device 400 is attached to a carrier 701 having a reflector 703 by an adhering material 704 wherein the carrier is a printed circuit board, a ceramics substrate, or a silicon substrate. In a preferred embodiment, the transparent substrate 404 is approximately perpendicular to the carrier 701. The p and n electrode of the light-emitting device 400 is electrically connected to the p and n electrode of the carrier respectively. The diffusers 702 are filled in the light-emitting diode device 20 to scatter the light emitted from the light-emitting device 400. The light (as the arrows indicating in FIG. 7) passes through the transparent substrate 404 and is emitted out from the second surface 404b to form a lateral light-emitting diode device 20.

Figure 8:
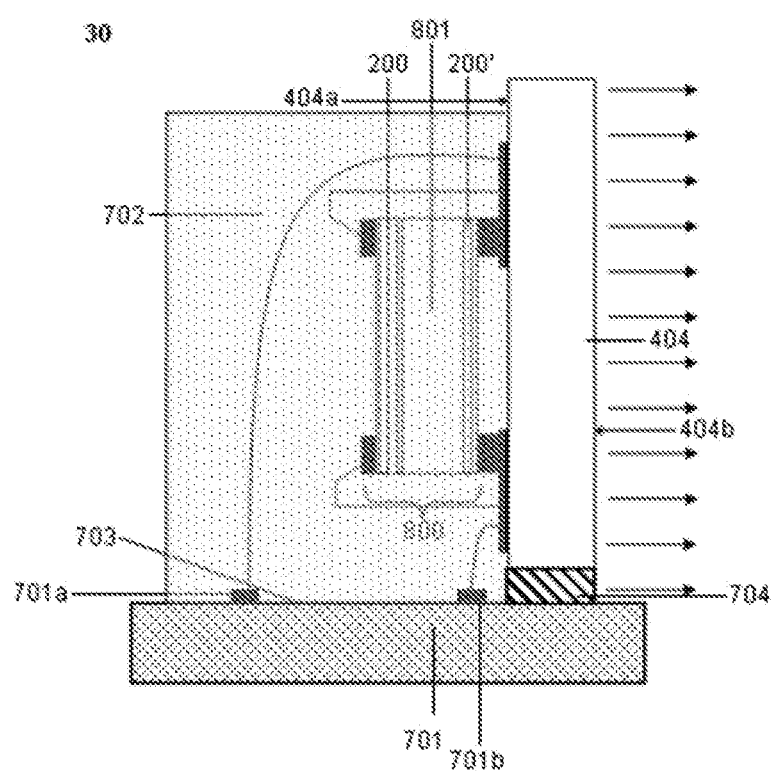
FIG. 8 is a lateral view of the light-emitting diode device of another embodiment of the present invention.

FIG. 8 is a lateral view of the light-emitting diode device 30 of another embodiment of the present application. A multi-LED structure 800 is formed by bonding two horizontal structures of the light-emitting diode chips 200 and 200' back to back through a connecting layer (not shown in the figure). The structure of the light-emitting diode chip 200 can comprise GaN series material which emits blue light and the structure of the light-emitting diode chip 200' can comprise AlGaInP series material which emits red light. Besides, an intermediate substrate 801 can be formed between the structures of the light-emitting diode chips 200 and 200'. The intermediate substrate 801 can be a transparent growth substrate of the blue light-emitting diode chip 200. Besides, a mirror (not shown in the figure) can be further formed at one side of the intermediate substrate 801 to enhance the light extraction efficiency of the light-emitting diode device 30.

The material of the connecting layer can be insulating material such as polyimide, BCB, PFCB, MgO, SUB, epoxy, Acrylic Resin, COC, PMMA, PET, PC, polyetherimide, fluorocarbon polymer, silicone, glass, Al$_2$O$_3$, SiO$_x$, TiO$_2$, SiN$_x$, SOG, or other organic adhesive material. The material of the connecting layer can also be a conductive material such as ITO, InO, SnO, CTO, ATO, AZO, ZTO, IZO, Ta$_2$O$_5$, DLC, Cu, Al, Sn, Au, Ag, Ti, Ni, Pb, Cr, Ag—Ti, Cu—Sn, Cu—Zn, Cu—Cd, Sn—Pb—Sb, Sn—Pb—Zn, Ni—Sn, Ni—Co, or Au alloy, and so on. The material of the connecting layer can also be a semiconductor layer such as ZnO, AlGaAs, GaN, GaP, GaAs, GaAsP, and so on.

The multi-LED structure 800 is attached to the transparent substrate 404 and electrically connected to the circuit (not shown in the figure) on the transparent substrate 404 through directly bonding, solder bonding, and/or wire bonding. The transparent substrate 404 of the light-emitting device 800 is further attached to a carrier 701 having a reflective surface 703 by an adhering material 704 wherein the carrier 701 is a printed circuit board, a ceramics substrate, or a silicon substrate. In a preferred embodiment, the transparent substrate 404 is approximately perpendicular to the carrier 701. The circuit (not shown in the figure) of the transparent substrate 404 is electrically connected to a first electrode (ex. p electrode) 701a and a second electrode (ex. n electrode) 701b of the carrier 701 respectively. Diffusers 702 are filled in the light-emitting diode device 30 to scatter the light emitted from the light-emitting device 800. The light (as the arrows indicating in FIG. 8) passes through the transparent substrate 404 and is emitted out from the second surface 404b. In this embodiment, the structure of the light-emitting diode chip 200 and the structure of the light-emitting diode chip 200' are electrically connected to each other in parallel.

Figure 9:
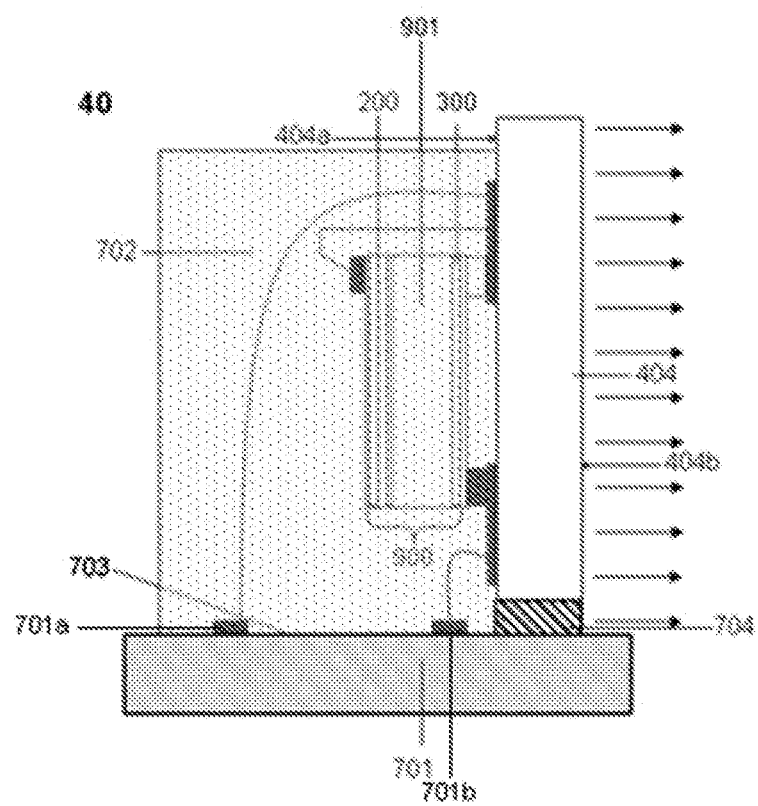
FIG. 9 is a lateral view of the light-emitting diode device of another embodiment of the present invention.

FIG. 9 is a lateral view of the light-emitting diode device 40 of one embodiment of the present application. A multi-LED structure 900 is formed by bonding one horizontal structure of the light-emitting diode chip 200 and one vertical structure of the light-emitting diode chip 300 back to back through a conductive bonding layer 901. The structure of the light-emitting diode chip 200 can comprise GaN series material which emits blue light and the structure of the light-emitting diode chip 300 can comprise AlGaInP series material which emits red light. Besides, an intermediate substrate (not shown in the figure) can be formed between the structures of the light-emitting diode chips 200 and 300. The intermediate substrate can be a transparent growth substrate of the blue light-emitting diode chip 200. Besides, a mirror (not shown in the figure) can be further formed at one side of the intermediate substrate to enhance the light extraction efficiency of the light-emitting diode device 40.

The multi-LED structure 900 is attached to the transparent substrate 404 and electrically connected to the circuit (not shown in the figure) on the transparent substrate 404 through directly bonding, solder bonding, and/or wire bonding. The transparent substrate 404 of a light-emitting device 900 is further attached to a carrier 701 having a reflective surface 703 by an adhering material 704 wherein the carrier 701 is a printed circuit board, a ceramics substrate, or a silicon substrate. In a preferred embodiment, the transparent substrate 404 is approximately perpendicular to the carrier 701. The circuit (not shown in the figure) of the transparent substrate 404 is electrically connected to a first electrode (ex. p electrode) 701a and a second electrode (ex. n electrode) 701b of the carrier 701 respectively. The diffusers 702 are filled in the light-emitting diode device 40 to scatter the light emitted from the light-emitting device 900. The light (as the arrows indicating in FIG. 9) passes through the transparent substrate 404 and is emitted out from the second surface 404b. In this embodiment, because the vertical structure of the light-emitting diode chip 300 is electrically connecting to the horizontal structure of light-emitting diode chip 200 through the conductive bonding layer 901, the structure of the light-emitting diode chip 200 and the structure of the light-emitting diode chip 300 are electrically connected to each other in series.

Figure 10:
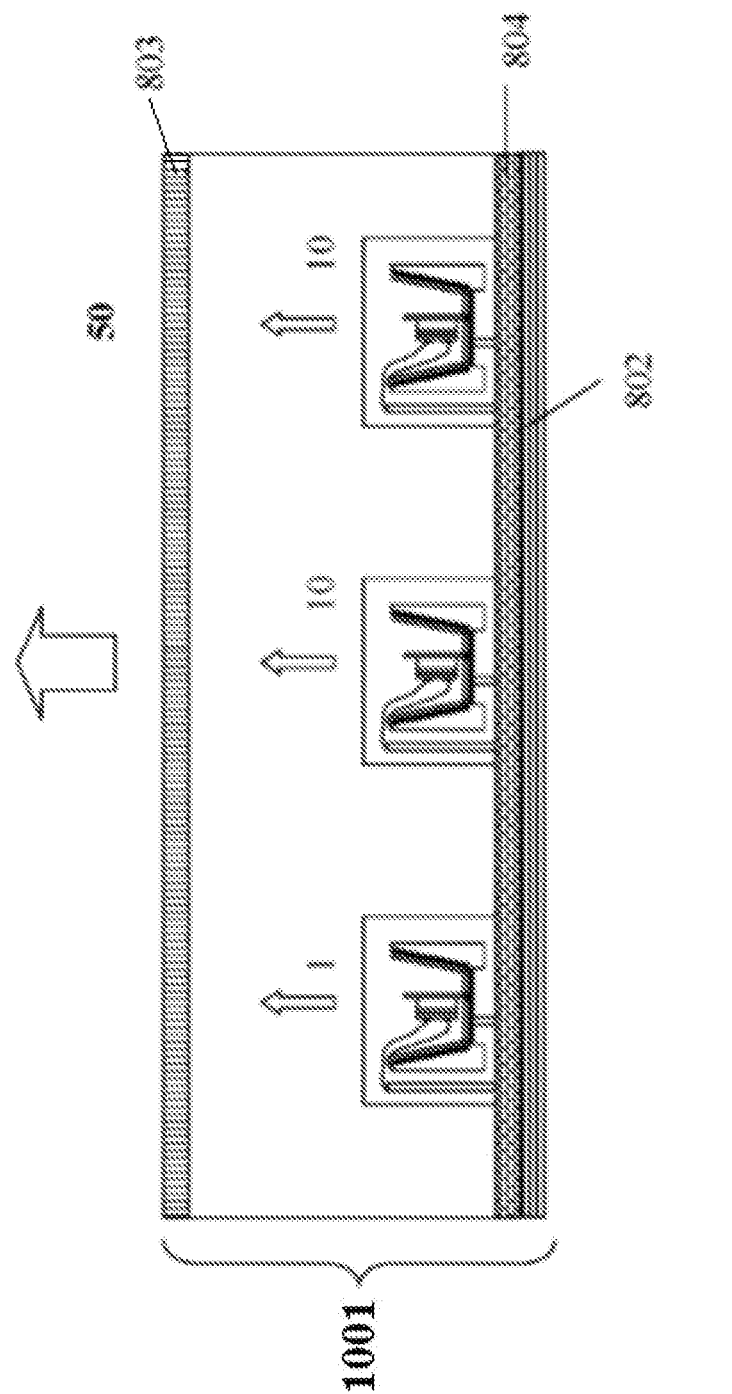
FIG. 10 is an illustration of the backlight module of the liquid crystal display device of the present invention.

FIG. 10 is a lateral-view of a backlight module 50 of the liquid crystal display devices accompanied with any one of the embodiments of the present application. A plurality of light-emitting diode devices 10 is attached to a carrier 1001 having a reflecting layer 802 on the bottom by an adhering material 804 wherein the carrier is a printed circuit board, a ceramics substrate, or a silicon substrate. The p and n electrode of the light-emitting device is electrically connected to the p and n electrode of the carrier respectively wherein the structure of the light-emitting diode device and the manufacturing method thereof is the same with illustration of FIG. 6 described above. The light emitted from the plurality light-emitting diode devices passes through the thin-film material 803 with different functions, such as prism sheet, to uniformly emit the desired light, and a backlight module 30 of the liquid crystal display device is formed accordingly.

Figure 11:
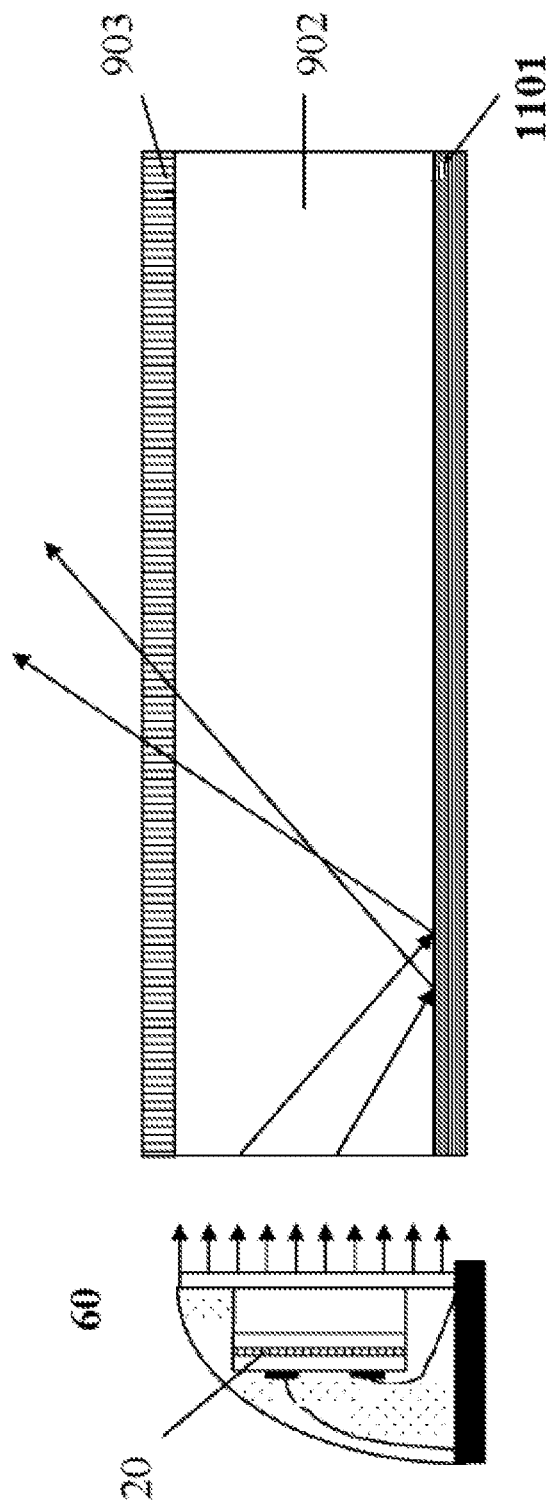
FIG. 11 is an illustration of another backlight module of the liquid crystal display device of the present invention.

FIG. 11 is an illustration of another backlight module 60 coupled with a polarizer of the liquid crystal display device as shown in FIG. 10. A polarizer 902 having a reflecting layer 1101 on the bottom is covered with a thin-film material 903 on the top layer. The polarizer coupled with a plurality of lateral light-emitting diode device 20 to form a backlight module 60 of the liquid crystal display device. The lateral light emitted from the backlight module 60 is guided to the polarizer 902 (as the arrows indicating in FIG. 11) wherein the downward light is reflected from the reflecting layer 1101 to the polarizer 902. The mixed and polarized light is emitted through the thin-film material 903 to the other structure of the liquid crystal display device, such as liquid crystal layer wherein the emitting direction of the light is as the arrows indicating in FIG. 11.

What is claimed is:

1. A light-emitting device, comprising:
    a carrier;
    a substrate disposed on the carrier, and comprising a first surface, a second surface opposite to the first surface, an upper surface, a lower surface and a side surface, wherein the upper surface, the lower surface and the side surface are arranged between the first surface and the second surface;
    a first light-emitting structure disposed on the first surface, and comprising a first height, a first electrode and a second electrode, wherein the first electrode and the second electrode are formed on a same side of the first light-emitting structure;
    a second light-emitting structure disposed on the first surface, separated from the first light-emitting structure by a distance which is greater than the first height, and comprising a third electrode and a fourth electrode, wherein the third electrode and the fourth electrode are formed on a same side of the second light-emitting structure;
    a connecting layer connected to the first light-emitting structure and the second light-emitting structure;
    a first terminal circuit merely formed on the first surface without bending to the upper surface, and electrically connected to the first electrode;
    a second terminal circuit merely formed on the first surface without bending to the lower surface, and electrically connected to the fourth electrode;
    a wire bonding electrically connecting the first light-emitting structure and the second light-emitting structure; and
    a structure, formed on the substrate in a configuration of directly covering the first light-emitting structure, the second light-emitting structure, and the first surface without crossing over the side surface, and comprising a top surface not parallel to the first surface, and a lateral surface substantially parallel to the first surface, wherein the light-emitting device is configured to emit light from the top surface and the lateral surface, and wherein the carrier is physically separated from the first terminal circuit and the second terminal circuit.

2. The light-emitting device of claim 1, further comprising an adhering material between the substrate and the carrier.

3. The light-emitting device of claim 1, wherein the carrier is a printed circuit board, a ceramics substrate, or a silicon substrate.

4. The light-emitting device of claim 1, wherein the first light-emitting structure comprises a first upper surface, a first lower surface opposite to the first upper surface and facing the connecting layer, and the first electrode is formed on the first upper surface.

5. The light-emitting device of claim 4, further comprising a reflective layer arranged under the first lower surface.

6. The light-emitting device of claim 1, wherein the first light-emitting structure and the second light-emitting structure are electrically connected to each other in series.

7. The light-emitting device of claim 1, wherein the connecting layer is made of insulating material or conductive material.

8. The light-emitting device of claim 1, wherein the connecting layer is made of resin.

9. The light-emitting device of claim 1, wherein the connecting layer and the first light-emitting structure substantially have a same width.

10. The light-emitting device of claim 1, wherein the connecting layer and the first light-emitting structure substantially have a same width.

11. The light-emitting device of claim 1, further comprising a wire electrically connected to the first terminal circuit.

12. The light-emitting device of claim 1, wherein the second surface is devoid of the structure.

13. The light-emitting device of claim 1, further comprising a growth substrate formed between the first light-emitting structure and the substrate.

14. The light-emitting device of claim 13, further comprising a mirror formed at a side of the growth substrate, wherein the mirror and the growth substrate have substantially a same width.

15. The light-emitting device of claim 1, further comprising an intermediate substrate between the first light-emitting structure and the second light-emitting structure.

16. The light-emitting device of claim 1, further comprising a reflector arranged on the carrier.

17. The light-emitting device of claim 1, wherein the carrier comprises a top surface which is covered by the structure.

18. The light-emitting device of claim 1, wherein the first light-emitting structure and the second light-emitting structure are configured to emit different color lights.

19. The light-emitting device of claim 1, wherein the first light-emitting structure and the second light-emitting structure are configured to emit a blue light and a red light, respectively.

20. The light-emitting device of claim 1, wherein the first light-emitting structure and the second light-emitting structure are electrically connected to each other in parallel.

* * * * *